(12) United States Patent
Liu et al.

(10) Patent No.: US 6,372,645 B1
(45) Date of Patent: Apr. 16, 2002

(54) METHODS TO REDUCE METAL BRIDGES AND LINE SHORTS IN INTEGRATED CIRCUITS

(75) Inventors: Chung-Shi Liu; Shau-Lin Shue; Chen-Hua Yu, all of Hsin-Chu; Shih-Chi Lin, Taipei; Ming-Jer Lee, Hsin-Chu; Ying-Lang Wang, Taichung County; Yu-Ku Lin, Hsin-chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/439,367

(22) Filed: Nov. 15, 1999

(51) Int. Cl.⁷ ............................................. H01L 21/44
(52) U.S. Cl. ...................... 438/688; 438/687; 438/627; 438/643
(58) Field of Search ................................ 438/688, 627, 438/637–640, 643, 653, 687

(56) References Cited

U.S. PATENT DOCUMENTS

| | | | |
|---|---|---|---|
| 5,141,896 A | 8/1992 | Katoh | 437/195 |
| 5,238,874 A | 8/1993 | Yamada | 437/1.98 |
| 5,288,665 A | 2/1994 | Nulman | 437/194 |
| 5,300,307 A | 4/1994 | Frear et al. | 427/96 |
| 5,318,923 A | 6/1994 | Park | 437/188 |
| 5,565,380 A | 10/1996 | Nemoto et al. | 437/198 |
| 5,665,641 A | 9/1997 | Shen et al. | 438/643 |
| 5,801,098 A | 9/1998 | Fiordalice et al. | 438/653 |
| 6,156,646 A | * 12/2000 | Ishihara | 438/652 |

FOREIGN PATENT DOCUMENTS

| | | | | |
|---|---|---|---|---|
| JP | 40111317 | * | 4/1992 | H01L/21/3205 |
| JP | 409283467 | * | 10/1997 | H01L/21/285 |

* cited by examiner

*Primary Examiner*—Charles Bowers
*Assistant Examiner*—Thanh Nguyen
(74) *Attorney, Agent, or Firm*—George O. Saile; Stephen B. Ackerman; Stephen G. Stanton

(57) ABSTRACT

In the first option of the present invention, a semiconductor structure is provided and an overlying titanium nitride barrier layer is deposited thereon at about 100° C. At least Al and Cu is sputtered over the titanium nitride barrier layer from about 270 to 300° C. to form an Al—Cu alloy containing metal layer. The sputtered Al—Cu alloy containing metal layer is promptly cooled at a cooling rate greater than about 100° C./minute to a temperature below 200° C. to form a Al—Cu alloy containing metal layer having minimal $CuAl_2$ grain growth. The semiconductor structure is removed from the cooling chamber and the semiconductor structure is processed further below 200° C. to form semiconductor device precursors. In the second option of the present invention, a semiconductor structure having an overlying barrier layer is provided. At least Al and Cu is sputtered over the barrier layer at a first temperature to form an Al—Cu alloy containing metal layer having $CuAl_2$ grains of a first average size. The semiconductor structure is processed and then heated to a second temperature to dissolve the $CuAl_2$ grains of a first average size then rapidly cooling to a third temperature whereby the $CuAl_2$ grains formed have a second average size within the Al—Cu alloy containing metal layer. The second average size $CuAl_2$ grains being less than the first average size $CuAl_2$ grains.

22 Claims, 4 Drawing Sheets

METHODS TO REDUCE METAL BRIDGES AND LINE SHORTS IN INTEGRATED CIRCUITS

FIELD OF THE INVENTION

The present invention relates generally to the reduction or elimination of deleterious metal bridges and line shorts in interconnects in microminiaturized integrated circuits and more specifically to methods for the reduction of theta phase copper ($CuAl_2$) growth in copper doped aluminum interconnects in microminiaturized integrated circuits in semiconductor devices.

BACKGROUND OF THE INVENTION

Aluminum-based alloy films have been widely used as wiring materials of semiconductor devices. At first, non-doped aluminum films alone had been used. As integrated circuits became smaller and smaller, aluminum silicon (Al—Si) alloy films began to be used to deal with the problem of so-called alloy spike phenomenon. With semiconductor patterns becoming finer, the current density for wirings increased and electromigration become an important reliability problem. This phenomenon accompanied Si precipitation, micro-void growth and the like which the Al—Si alloy films/wirings were unable to handle.

Therefore, Al—Cu alloy films were introduced. Al—Cu alloy films are generally deposited by sputtering the metals on a semiconductor substrate. As deposited, the alloy is not a uniform solid solution with Al and Cu evenly distributed on the wafer substrate. Cu tends to react with Al to form theta phase copper, or $CuAl_2$, nodular collections. The theta phase copper ($CuAl_2$) would precipitate at the grain boundaries thus blocking mass transport of Al by the current which favorably reduced Al electromigration. Additional elements may form a part of the Al—Cu alloy containing metal, for example Al—Si—Cu alloys.

It is expected that as the temperature is elevated, Cu will travel, or diffuse through the Al lattice and seek out precipitates where it would chemically bond with Al atoms and cause the $CuAl_2$ precipitate to grow. The Cu in the $CuAl_2$ precipitate is in a lower energy state than the Cu in the solid solution alloy (bulk Al lattice) and thus the Cu tends to be bound in the theta phase rather than remain in the Al lattice. However, as wiring widths now approach grain size, the larger $CuAl_2$ grain growth is more difficult to etch and may, among other things, lead to metal bridges and line shorts between adjacent interconnects or metal lines decreasing reliability.

U.S. Pat. No. 5,300,307 to Frear et al. describes a process for forming Al—Cu conductive thin films having reduced electromigration failures including the heat treatment or annealing of the thin film conductor at a temperature between 200 and 300° C. for between 10 minutes and 24 hours under a reducing atmosphere such as 15% $H_2$ in $N_2$ by volume. This creates $CuAl_2$ grain growth at the Al—Cu alloy grain boundaries.

U.S. Pat. No. 5,565,380 to Nemoto et al. describes a process for fabricating a semiconductor device having an interconnecting line formed of aluminum containing a predetermined additive element, such as Cu, wherein a segregate layer of the additive element is formed along aluminum grain boundaries in the interconnecting line on the basis of a heat treatment after the formation of the interconnecting line.

U.S. Pat. No. 5,238,874 to Yamada describes a laminated film consisting of an Al—Si—Cu alloy film and a refractory metal silicide film that includes Cu to reduce its electromigration while maintaining its good stressmigration characteristics. When the refractory metal silicide film is a tungsten silicide film, the Cu concentration is from 0.1 to 1.0 wt. %.

U.S. Pat. No. 5,318,923 to Park describes a method of forming a metal layer in a semiconductor device having a first process for depositing a metal at an optional temperature after forming the pattern of a contact hole, and a second process for annealing the deposited metal in a sputtering reaction chamber to fill up the contact with the metal.

U.S. Pat. No. 5,801,098 to Fiordalice et al. describes a method of decreasing resistivity in an electrically conductive layer using a high density plasma sputtering technique to deposit the electrically conductive layer over the substrate.

U.S. Pat. No. 5,665,641 to Shen et al. describes a process for forming a hard mask over an aluminum-containing layer for patterning and etching the aluminum-containing layer to define interconnects. The material comprising the hard mask is deposited at a temperature between about 100° C. below the sputtering temperature of the aluminum-containing metal.

U.S. Pat. No. 5,288,665 to Nulman describes a process for forming an aluminum plug in a via in an insulating layer in an integrated circuit structure by first depositing a layer of aluminum over the insulating layer in a multistep deposition which will also result in filling the via with aluminum to form an aluminum plug, followed by removal of any additional aluminum formed over the surface of the insulating layer, and subsequent formation of one or more patterned conductive layers over the insulating surface which is in electrical communication with the underlying aluminum plug or via.

U.S. Pat. No. 5,141,896 to Katoh describes forming an inter-level insulating film at solid crossing points between upper level interconnections and lower-level interconnections, excepting via hole portions, in an semiconductor device. This provides mechanical support between interconnection levels and provides semiconductor devices having high durabilities against thermal and mechanical impacts.

SUMMARY OF THE INVENTION

Accordingly, it is an object of the present invention to provide improved methods of forming Al—Cu alloy containing metal interconnects.

Another object of the present invention is to provide improved methods of eliminated or reducing metal bridges and line shorts between interconnects or metal lines in semiconductor devices.

A further object of the present invention is to provide an improved method of forming Al—Cu alloy containing metal interconnects by sputtering an Al—Cu alloy containing metal layer followed by immediate cooling to minimize the growth of $CuAl_2$ grains.

Yet another object of the present invention is to provide an improved method of forming Al—Cu alloy containing metal interconnects by sputtering an Al—Cu alloy containing metal layer, further processing of the semiconductor structure, then heating the semiconductor structure followed by prompt rapid cooling to minimize the growth of $CuAl_2$ grains.

Other objects will appear hereinafter.

It has now been discovered that the above and other objects of the present invention may be accomplished in the following manner. Specifically, in the first option of the present invention a semiconductor structure is provided and an overlying titanium nitride barrier layer is deposited thereon at about 100° C. The semiconductor structure is loaded into a sputtering chamber and at least Al and Cu is sputtered over the titanium nitride barrier layer at about 270 to 300° C. to form an Al—Cu alloy containing metal layer. The semi-conductor structure is then immediately transferred from the sputtering chamber into a cooling chamber and the sputtered Al—Cu alloy containing metal layer is cooled at a cooling rate greater than about 100° C./minute to a temperature below 200° C. to form a Al—Cu alloy containing metal layer having minimal $CuAl_2$ grain growth. The semiconductor structure is removed from the cooling chamber and the semiconductor structure is processed further below 200° C. to form semiconductor device precursors. The Al—Cu alloy containing metal layer is then patterned to form Al—Cu alloy containing metal lines and processing of the semiconductor structure is completed to form semiconductor devices having greater reliability due to the minimal $CuAl_2$ grain growth.

In the second option of the present invention, a semiconductor structure having an overlying barrier layer is provided. At least Al and Cu is sputtered over the barrier layer at a first temperature to form an Al—Cu alloy containing metal layer having $CuAl_2$ grains of a first average size. The semiconductor structure is processed, for example by the formation of ARC (anti-reflective coating) and BARC (bottom ARC) layers, and then heated to a second temperature to dissolve the $CuAl_2$ grains of a first average size then rapidly cooling to a third temperature whereby the $CuAl_2$ grains formed have a second average size within the Al—Cu alloy containing metal layer. The second average size $CuAl_2$ grains being less than the first average size $CuAl_2$ grains. The semiconductor structure is completed to form semiconductor devices having greater reliability due to the decreased second average size of $CuAl_2$ grains.

| First Option | Second Option |
| --- | --- |
| IMD formation | IMD formation |
| Barrier layer formation (TiN) | Barrier layer formation (TiN) |
| Key Step: Al-Cu alloy containing layer sputtering AND Immediate cooling >100° C./minute | Al-Cu alloy containing layer sputtering |
| ARC layer formation (TiN) | ARC layer formation (TiN) BARC layer formation (SiON) Key Step: Heating to about 350° C. and Immediate cooling >100° C./minute |
| Photoresist layer deposition | Photoresist layer deposition |
| Patterning of Al-Cu alloy containing metal lines | Patterning of Al-Cu alloy containing metal lines |

The cooling rates for each above option are controlled by an argon (Ar) purge in chamber and a cooling water cooled wafer stage. Higher temperature wafers will generally have higher cooling rates.

BRIEF DESCRIPTION OF THE DRAWINGS

The features and advantages of the methods of reducing or eliminating metal bridges and line shorts between interconnects or metal lines according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

Figure 1:
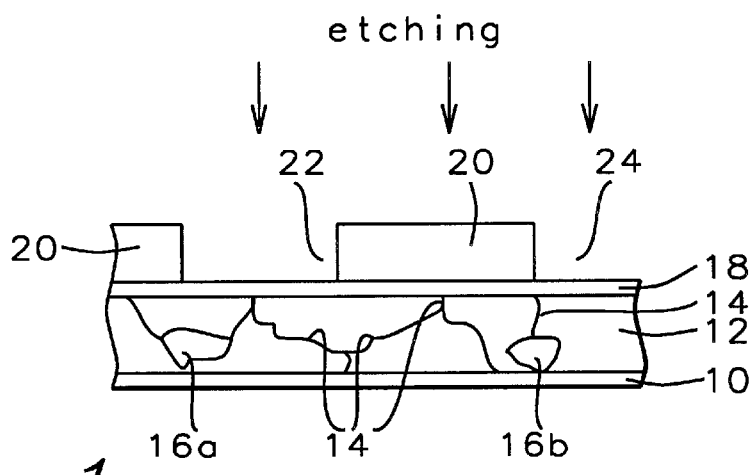
FIGS. 1 to 4 show a series of schematic cross-sectional diagrams illustrating the previous results of progressive stages of forming an isolation trench, within a Al—Cu alloy containing metal layer within a semiconductor structure employed in integrated circuit fabrication.

FIGS. 1–4 illustrate some of the difficulties encountered with large grain theta phase copper ($CuAl_2$) formation in fabricating narrow Al—Cu alloy containing metal interconnects in semiconductor devices. As shown in FIG. 1, barrier layer 10, comprised of titanium nitride (TiN) overlies a semiconductor structure (not shown) and, usually, an upper intermetal dielectric layer (IMD) on the semiconductor structure. An Al—Cu alloy containing metal layer 12, having grain boundaries 14, is deposited over barrier layer 10, usually by sputtering. As discussed above, theta phase copper ($CuAl_2$) 16a, 16b precipitates at Al—Cu grain boundaries 14.

An anti-reflective coating (ARC) 18, which may be TiN, may be deposited over Al—Cu alloy containing metal layer 12. A photoresist layer 20 is then deposited over ARC layer 18 and is patterned as shown in FIG. 1 in preparation of forming isolation trenches, or vias, 22, 24 in Al—Cu alloy containing metal layer 12.

As shown, for narrow, e.g. 0.3 μm wide, isolation trenches 22,24, theta phase copper grains 16 are relatively large in relation to trenches 22, 24. Further, a phenomenon known as the micro loading effect further complicates matters. The micro loading effect, simply stated, is when the ions used to etch narrow trenches, such as isolation trenches 22, 24, get in each other's way and lowers the ion bombardment and etching rate.

Figure 2:
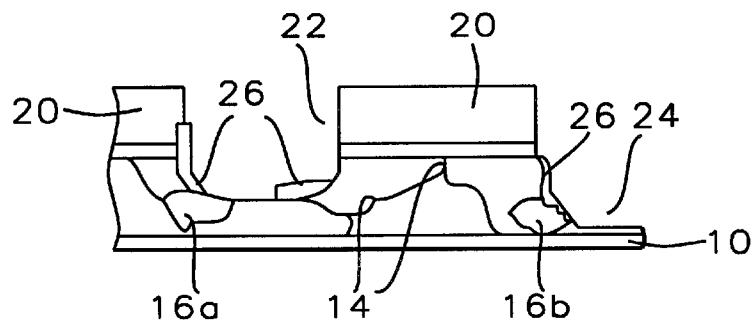

As shown in FIG. 2, etching starts to form trenches 22, 24 in Al—Cu alloy containing metal layer 12. An etching by-product 26, polymer, forms along the side walls of trenches 22, 24. Since $CuCl_2$ is a solid, only ion bombardment can remove it during dry etch. It is noted that the more open area of trench 24 etches more rapidly. However, in both isolation trenches 22, 24, theta phase copper grains 16a, 16b resist etching.

Figure 3:
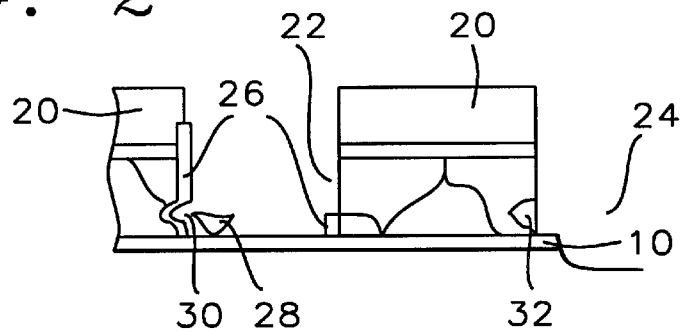

FIG. 3 shows the results of continued etching. Theta phase copper grain 16a remnant 28 rests on top of barrier layer 10. Cavity 30 within Al—Cu alloy containing metal layer 12 sidewall of trench 22 remains after the removal of the bulk of theta phase copper grain 16a. Etching by-product 26 is essentially removed from the more open isolation trench 24 but remains in more narrow isolation trench 22 as shown, and lines cavity 30. Theta phase copper grain 16*a* remnant 32 remains embedded within cavity 34 in Al—Cu alloy containing metal layer 12 sidewall of isolation trench 24.

Figure 4:
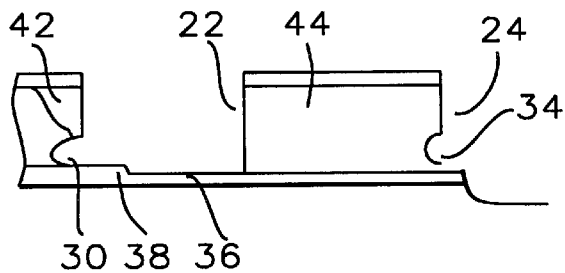

FIG. 4 shows the results of photoresist (PR) stripping. Theta phase copper grain remnants 28, 32 have been removed leaving cavities 30, 34, respectively. Partial TiN residue remains at 36 and a full TiN residue remains at 38 in trench 22. The bulk of etching by-product 26 having been removed in trench 22 during PR stripping. An insulating dielectric is then deposited between metal lines 42, 44 within isolation trench 22 (and also within isolation trench 24). TiN residues 36, 38 form a metal bridge or line short between Al—Cu containing alloy metal lines 42, 44 and, with cavities 30, 34, contribute to lower reliability in finished semiconductor devices.

Figure 5:
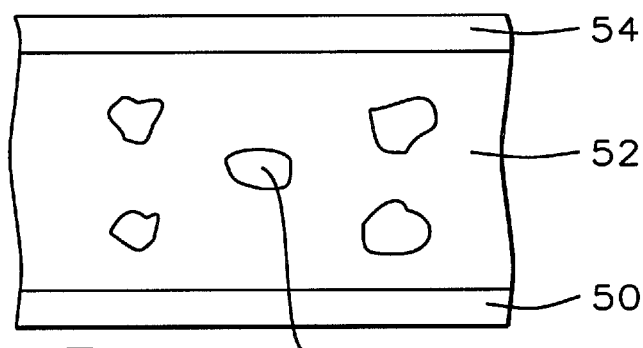
FIGS. 5 to 7 show a series of schematic cross-sectional diagrams illustrating the results of the second option of the present invention of forming an Al—Cu alloy containing metal layer.
Figure 6:
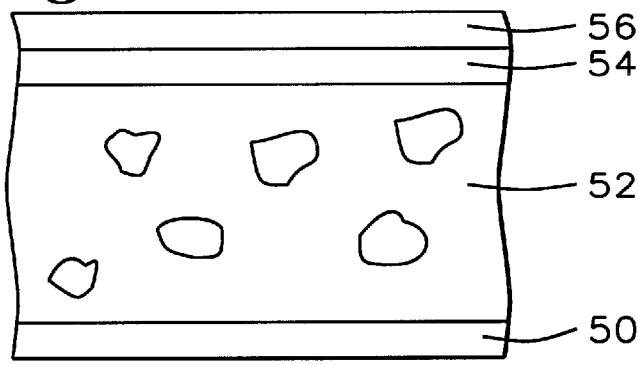
Figure 7:
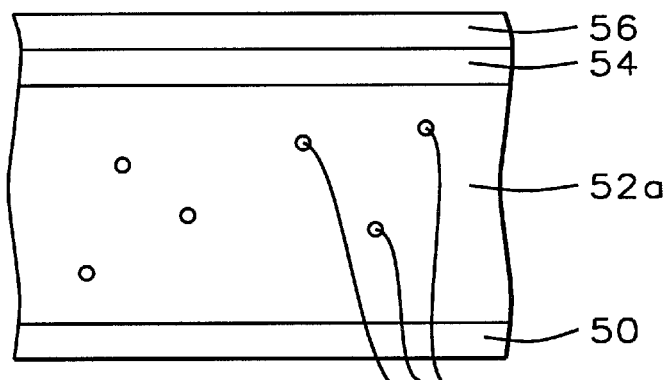
Figure 8:
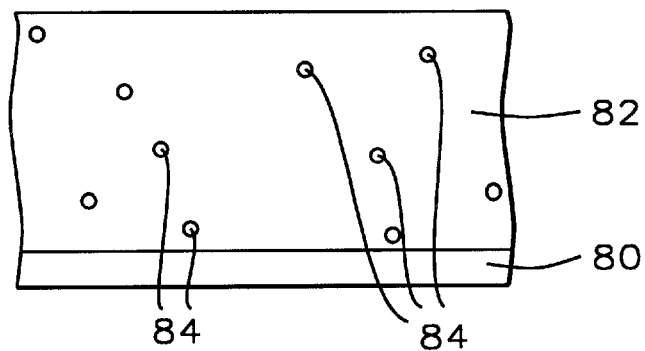
FIG. 8 is a schematic cross-sectional diagram illustrating the results of the method of the first option of the present invention of forming an Al—Cu alloy containing metal layer.
Figure 9:
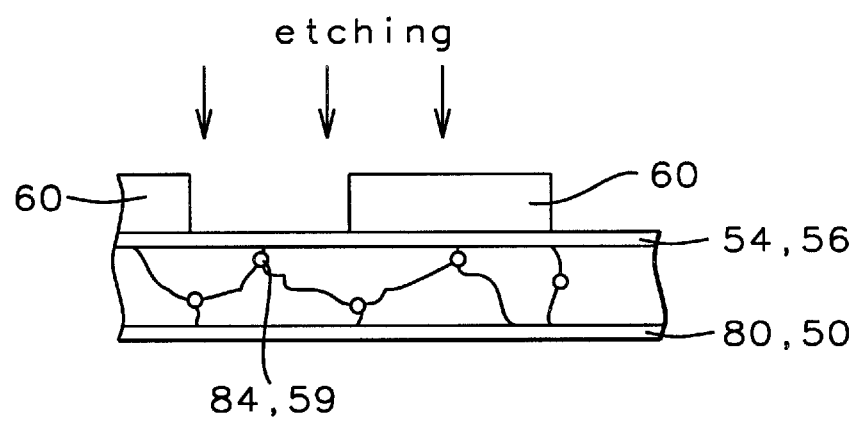
FIGS. 9 and 10 show a series of schematic cross-sectional diagrams illustrating the results of progressive stages of forming an isolation trench, within a Al—Cu alloy containing metal layer within a semiconductor structure employed in integrated circuit fabrication using either the first or second options of the present invention.
Figure 10:
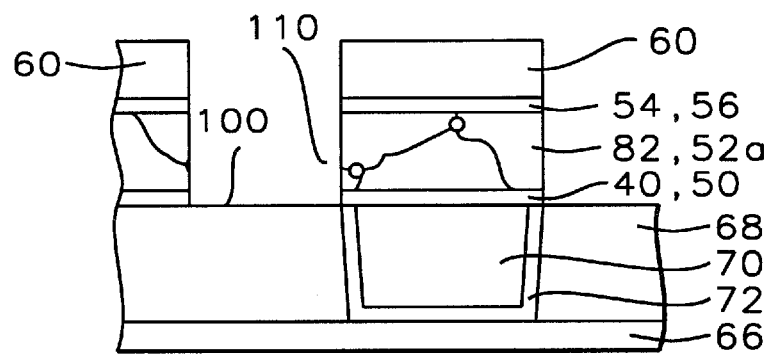

FIG. 8 shows a cross-sectional view of the formation of Al—Cu alloy containing metal layer 82 in one option and FIGS. 5–7 show cross-sectional views of the formation and heat treatment of Al—Cu alloy containing metal layer 52, 52*a* in the other option of the present invention. FIGS. 9 and 10 are common to both options and show the steps in patterning the Al—Cu alloy containing metal layer 82, 52*a* formed from the first and second options, respectively, to form Al—Cu alloy containing metal lines having minimal $CuAl_2$ grain growth over, for example tungsten (W) plug 70 having barrier layer 72. Semiconductor structure 66 is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

First Option

Figure 11:
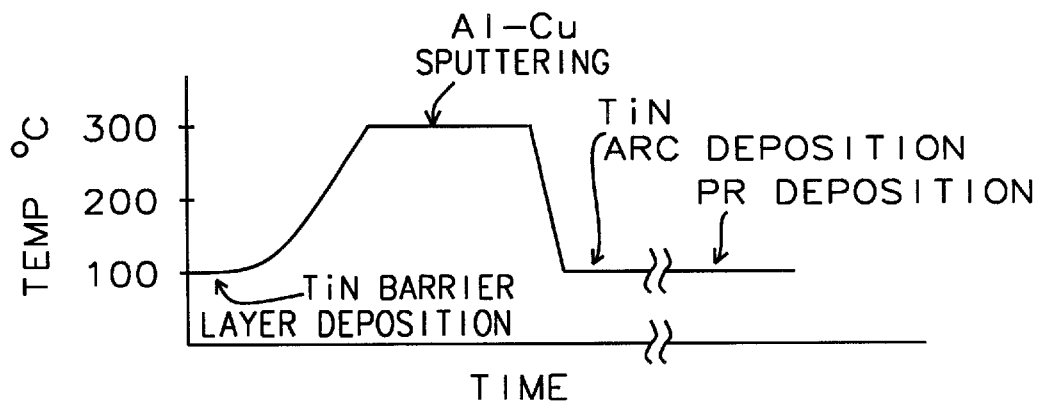
FIGS. 11 and 12 graph temperature versus time for the first and second options, respectively, of the present invention.
Figure 12:
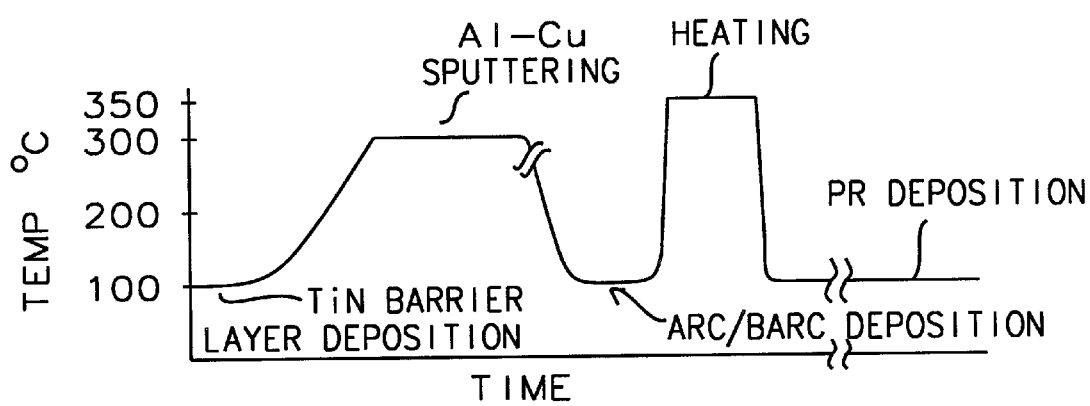

In the first option of the present invention (see FIGS. 8–11) semiconductor structure 66, shown with [optional] intermetal dielectric (IMD) layer 68, has an overlying barrier layer 80. Intermetal dielectric layer 68 overlies other conductive and insulating layers (e.g., interlevel dielectric layers) not shown. FIG. 11 graphs temperature versus time for the first option.

For the first option, barrier layer 80 may comprise Ti, TaN, or a dual layer of Ti/TiN and is more preferably titanium nitride (TiN). TiN layer 80 can be formed by CVD (chemical vapor deposition or sputtering and is preferably sputtered at a temperature between 90 and 110° C. and most preferably at about 100° C.

The invention's barrier layers and Al—Cu layers can all be formed in a multi-chamber tool such as an Endura™ tool model VHP/PVD™ manufactured by Applied Materials of California, USA. Other tools that can be used are the M2000 model by Varian, or the M2I model by Varian. For example TiN barrier layer 80 can be sputter deposited in a first chamber and then transferred to another chamber for the sputter of Al—Cu alloy containing metal layer 82.

The semiconductor structure can then be transferred to another chamber in the multi-chamber Endura tool. The semiconductor structure is placed into a sputtering chamber within the Endura tool and, as shown in FIG. 8, an Al—Cu containing alloy layer 82 is deposited by sputtering over barrier layer 40 by sputtering at least Al and Cu at the following conditions: temperature between about 270 and 300° with about 270° C. most preferred; Ar gas flow from about 20 to 50 sccm and more preferably at about 33 sccm; a DC power of about 12 kW; and a pressure from about 0.5 to 5 Torr and more preferably at about 1 Torr. The Al—Cu containing alloy may comprise an AlSiCu alloy and the preferred composition of the Al—Cu containing alloy layers is 99.5% Al and 0.5% Cu. $CuAl_2$ precipitates are most likely when the Al—Cu composition of metal layer 82 is from about 0.4 to 4% Cu.

Al—Cu alloy containing metal layer 82 is from about 3000 to 10,000 Å thick and more preferably about 4000 Å thick.

Tests have demonstrated that the longer the wait time (e.g., time at high temperature (>270° C.) after sputtering), the larger the theta phase Cu (i.e., $CuAl_2$) grain size. For example, for a 350 second wait time, the $CuAl_2$ grain size was from 0.14 to 0.3 µm with a distribution of 10 at 15 K magnification while if the wait time was decreased to 40 seconds, the $CuAl_2$ grain size was reduced to from 0.05 to 0.1 µm with a distribution of only 6 at 15 K magnification. Thus the sputtered Al—Cu alloy containing metal layer 42 must be cooled quickly to minimize $CuAl_2$ grain size 84.

Next, after sputtering Al—Cu alloy containing metal layer 82, the structure is immediately rapidly cooled. Preferably the structure is transferred to a cooling chamber. The semiconductor structure is preferably immediately transferred from the sputtering chamber to a separate cooling chamber within the Endura tool and is cooled under high vacuum at a cooling rate greater than about 100° C. to room temperature or at least less than about 200° C. It is only necessary to cool the semiconductor structure very rapidly. The semiconductor structure may be air cooled in an air cooling chamber, or water cooled on a pedestal within a cooling chamber. This maintains the average grain size of the $CuAl_2$ formed 84 about 0.1 µm and between about 0.05 to 0.2 µm.

In addition to cooling Al—Cu alloy containing metal layer 82 in a cooling chamber, the wafer can be rapidly cooled within the AlCu alloy containing metal layer 82 sputter chamber.

Next, TiN layer 54 is formed thereover. Preferably, the semiconductor structure is transferred to another sputter chamber for deposition of a layer of TiN layer 54, at about between 50 and 100° C., over the Al—Cu alloy containing metal layer that acts as an anti-reflective coating (ARC). Other such anti-reflective coatings may be SiON, dual layers of Ti/TiN, or dual layers of TiN/SiON.

Further processing may then be done as long as the temperature is kept below 200° C. before the metal dry etch to form the Al—Cu alloy containing metal lines 82 since $CuAl_2$, or theta phase copper, precipitates, or forms, above that temperature. A dielectric layer (not shown) is deposited within trenches 110 to electrically isolate Al—Cu alloy containing metal lines 82.

The barrier layers and Al—Cu alloy containing metal layer 82 are patterned preferably using a photoresist mask 60 and etch process as shown in FIGS. 9 and 10.

The inventors have found a fifteen percent (15%) improvement in yield at the M1 metal layer when Al—Cu alloy containing metal lines were formed in accordance with the first option of the present invention. No TiN residue was detected at 100 after etching of Al—Cu alloy containing metal layer 82, thus minimizing or eliminating metal bridges and line shorts between the metal lines. These results were possible because of the reduced grain size of theta phase copper formed 84.

Second Option

In the second option of the present invention, shown in FIGS. 5–7, and FIGS. 9, 10, and 12 barrier layer 50 may comprise dual layers of Ti/TiN or TaN and is more preferably titanium nitride (TiN) deposited over intermetal dielectric layer 68 (see FIG. 10). The invention's barrier layers and Al—Cu layers can all be formed in a multi-chamber tool such as the Endura™ tool model VHP/PVD™ .Al—Cu containing alloy layer 52 is then formed over barrier layer 50 by sputtering at least Al and Cu at the following conditions: temperature between about 270 and 300° with 270° C. most preferred; Ar gas flow from about 20 to 50 sccm; and a pressure from about 0.5 to 5 Torr. The preferred composition of the Al—Cu containing alloy layers is 99.5% Al and 0.5% Cu.

The semiconductor structure is further processed, for example anti-reflective coating (ARC) 54, more preferably TiN, may be deposited over Al—Cu containing alloy layer 52 at about 100° C. ARC layer 54 may also comprise SiON, TiN and SiN, or a dual layer of Ti/TiN. A bottom anti-reflective coating (BARC) 56, more preferably SiON, may then be deposited over ARC layer 54.

In a key step, before Al—Cu alloy containing metal layer 82 is patterned, layer 82 is heated and rapidly cooled to reduce the $CuAl_2$ particles. For example, before the photoresist coating 60 is applied, the semiconductor structure is heated, either in-situ or ex-situ, at from about 340 to 450° C., and more preferably 400° C., for about 0.5 to 2 minutes and more preferably for at least two (2) minutes, then the semiconductor structure is transferred to a cooling chamber and is immediately quenched to about 200° C. or more preferably room temperature, at a rate of from about 100 to 200° C./minute and more preferably greater than 100° C./minute. The wafer is preferably heated in an Endura™ RTP or degas chamber and is preferably quenched in an Endura™ system cooling down chamber. The wafer is cooled in a cooling chamber as noted above and is water cooled on a wafer stage in a cooling chamber with an Ar purge in the chamber.

The heating dissolves the larger grain $CuAl_2$ 57 to smaller, or minimal grain $CuAl_2$ 59 and the rapid quenching prevents re-precipitation of larger grain $CuAl_2$. The average grain size of the minimal $CuAl_2$ (theta phase copper) 59 within Al—Cu containing alloy layer 52a is below about 0.5 μm and between about 0.01 to 0.1 μm.

Photoresist coating 60 is then deposited over Al—Cu alloy containing metal layer 52a having minimal $CuAl_2$ grain 59, and is patterned as shown in FIG. 9. Al—Cu alloy containing metal lines 52a are then formed by, for example a lithographic etch. Remaining photoresist coating 60 is removed and a dielectric layer is deposited within trenches 110 to electrically isolate Al—Cu alloy containing metal lines 52a.

As in the first option, no TiN residue was detected at 100 after etching of Al—Cu alloy containing metal layer 52a, thus minimizing or eliminating metal bridges and line shorts between the metal lines. These results were possible because of the reduced grain size of theta phase copper formed 59.

While particular options of the present invention have been illustrated and described, it is not intended to limit the invention, except as defined by the following claims.

We claim:

1. A method of forming Al—Cu alloy containing metal interconnects, comprising the steps of:

providing a semiconductor structure having an overlying barrier layer;

loading said semiconductor structure into a sputtering chamber;

sputtering at least Al and Cu over said barrier layer at a first temperature to form an Al—Cu alloy containing metal layer;

immediately transferring said semiconductor structure from said sputtering chamber into a cooling chamber;

cooling said sputtered Al—Cu alloy containing metal layer at a cooling rate to a second temperature to form a Al—Cu alloy containing metal layer having minimal $CuAl_2$ grain growth;

removing said semiconductor structure from said cooling chamber;

further processing said semiconductor structure below a third temperature to form semiconductor device precursors;

patterning said Al—Cu alloy containing metal layer to form Al—Cu alloy containing metal lines;

completing processing of said semiconductor structure to form semiconductor devices having greater reliability due to said minimal $CuAl_2$ grain growth.

2. The method of claim 1, wherein said sputtering of said Al—Cu alloy containing metal layer is achieved at the following parameters: about 12 kW DC; about 270° C.; Ar flow at about 33 sccm; to a depth of about 3000 to 10,000 Å; to a composition of about 99.5% Al/0.5% Cu; at a pressure of about 1 Torr.

3. The method of claim 1, wherein said cooling chamber is under a high vacuum and said cooling rate is greater than from 100 to 150° C./minute and said second temperature is room temperature.

4. The method of claim 1, wherein said cooling rate is greater than about 100° C./minute and said second temperature is less than about 200° C.

5. The method of claim 1, wherein said third temperature is from about 25 to 200° C.

6. The method of claim 1, wherein said third temperature is from about 70 to 245° C. less than said first temperature.

7. The method of claim 1, wherein said third temperature is about 150° C. less than said first temperature.

8. The method of claim 1, wherein said third temperature no more than 200° C.

9. The method of claim 1, wherein said Al—Cu containing alloy is selected from the group comprising AlCu and AlSiCu.

10. The method of claim 1, wherein said barrier layer is selected from the group comprising TiN, Ti/TiN, and TaN.

11. The method of claim 1, wherein said $CuAl_2$ grains are less than about 0.1 μm in average size.

12. A method of forming Al—Cu alloy containing metal interconnects, comprising the steps of:

providing a semiconductor structure;

depositing an overlying titanium nitride barrier layer at about 100° C.;

loading said semiconductor structure into a sputtering chamber;

sputtering at least Al and Cu over said titanium nitride barrier layer from about 270 to 300° C. to form an Al—Cu alloy containing metal layer;

immediately transferring said semiconductor structure from said sputtering chamber into a cooling chamber;

cooling said sputtered Al—Cu alloy containing metal layer at a cooling rate greater than about 100° C./minute to a temperature below 200° C. to form a Al—Cu alloy containing metal layer having minimal $CuAl_2$ grain growth;

removing said semiconductor structure from said cooling chamber;

further processing said semiconductor structure below 200° C. to form semiconductor device precursors;

patterning said Al—Cu alloy containing metal layer to form Al—Cu alloy containing metal lines;

completing processing of said semiconductor structure to form semiconductor devices having greater reliability due to said minimal $CuAl_2$ grain growth.

13. A method of forming Al—Cu alloy containing metal interconnects, comprising the steps of:

providing a semiconductor structure having an overlying barrier layer;

sputtering at least Al and Cu over said barrier layer at a first temperature to form an Al—Cu alloy containing metal layer having $CuAl_2$ grains of a first average size;

processing said semiconductor structure;

heating said semiconductor structure to a second temperature to dissolve said $CuAl_2$ grains of a first average size;

rapidly cooling said heated semiconductor structure to a third temperature whereby said $CuAl_2$ grains formed have a second average size within said Al—Cu alloy containing metal layer; said second average size being less than said first average size; and completing processing of said semiconductor structure to form semiconductor devices having greater reliability due to said decreased second average size of said $CuAl_2$ grains.

14. The method of claim 13, wherein said sputtering of said Al—Cu alloy containing metal layer is achieved at the following parameters: about 12 kW DC; about 270° C.; Ar flow at about 33 sccm; to a depth of about 3000 to 10,000 Å; to a composition of about 99.5% Al/0.5% Cu; at a pressure of about 1 Torr.

15. The method of claim 13, wherein said second temperature is from about 330 to 450° C.

16. The method of claim 13, wherein said second temperature is about 400° C.

17. The method of claim 13, wherein said third temperature is from about 100 to 200° C.

18. The method of claim 13, wherein said third temperature is about 150° C.

19. The method of claim 13, where said second average $CuAl_2$ grain size is from about 0.01 to 0.1 μm.

20. A method of forming Al—Cu alloy containing metal interconnects, comprising the steps of:

providing a semiconductor structure having an overlying barrier layer;

sputtering at least Al and Cu over said barrier layer at a first temperature to form an Al—Cu alloy containing metal layer having $CuAl_2$ grains of a first average size;

processing said semiconductor structure;

heating said semiconductor structure to a second temperature to dissolve said $CuAl_2$ grains of a first average size; said second temperature being about 400° C.;

rapidly cooling said heated semiconductor structure to a third temperature whereby said $CuAl_2$ grains formed have a second average size within said Al—Cu alloy containing metal layer; said second average size being less than said first average size; said third temperature being about 150° C.; and completing processing of said semiconductor structure to form semiconductor devices having greater reliability due to said decreased second average size of said $CuAl_2$ grains.

21. The method of claim 20, where said second average $CuAl_2$ grain size is from about 0.01 to 0.1 μm.

22. A method of forming Al—Cu alloy containing metal interconnects, comprising the steps of:

providing a semiconductor structure having an overlying barrier layer;

sputtering at least Al and Cu over said barrier layer at a first temperature to form an Al—Cu alloy containing metal layer having $CuAl_2$ grains of a first average size;

processing said semiconductor structure;

heating said semiconductor structure to a second temperature to dissolve said $CuAl_2$ grains of a first average size; said second temperature being from about 330 to 450° C.

rapidly cooling said heated semiconductor structure to a third temperature whereby said $CuAl_2$ grains formed have a second average size within said Al—Cu alloy containing metal layer; said second average size being less than said first average size; said third temperature being from about 100 to 200° C.; said second average $CuAl_2$ grain size being from about 0.01 to 0.1 μm; and completing processing of said semiconductor structure to form semiconductor devices having greater reliability due to said decreased second average size of said $CuAl_2$ grains.

* * * * *